(12) United States Patent
Scott

(10) Patent No.: US 9,184,714 B2
(45) Date of Patent: Nov. 10, 2015

(54) MUSICAL INSTRUMENT MASTER VOLUME AMPLIFIER

(75) Inventor: James Edward Scott, Franklin, TN (US)

(73) Assignee: 3RD POWER AMPLIFICATION, LLC, Franklin, TN (US)

( * ) Notice: Subject to any disclaimer, the term of this patent is extended or adjusted under 35 U.S.C. 154(b) by 591 days.

(21) Appl. No.: 13/560,641

(22) Filed: Jul. 27, 2012

(65) Prior Publication Data

US 2013/0028447 A1    Jan. 31, 2013

Related U.S. Application Data

(60) Provisional application No. 61/512,269, filed on Jul. 27, 2011.

(51) Int. Cl.
 *H03G 3/06*    (2006.01)

(52) U.S. Cl.
 CPC ...................................... *H03G 3/06* (2013.01)

(58) Field of Classification Search
 CPC ............. H03G 3/06; H03G 1/00; H03F 1/327
 USPC .............. 381/61, 63, 120, 109; 330/127, 139, 330/142, 118, 150, 145; 84/737, 738, 740
 See application file for complete search history.

(56) References Cited

U.S. PATENT DOCUMENTS

| | | | | |
|---|---|---|---|---|
| 4,211,893 A | * | 7/1980 | Smith | 381/118 |
| 4,495,640 A | * | 1/1985 | Frey | 381/61 |
| 4,701,957 A | * | 10/1987 | Smith | 381/61 |
| 4,937,874 A | | 6/1990 | Pittman et al. | |
| 5,023,915 A | * | 6/1991 | Brown et al. | 381/120 |
| 5,268,527 A | * | 12/1993 | Waller, Jr. | 84/736 |
| 5,550,509 A | | 8/1996 | Trentino | |
| 5,635,872 A | | 6/1997 | Zimmerman | |
| 5,675,656 A | * | 10/1997 | Sondermeyer et al. | 381/61 |
| 5,727,069 A | | 3/1998 | Hughes et al. | |
| 6,111,961 A | * | 8/2000 | Hedrick et al. | 381/61 |
| 6,140,870 A | * | 10/2000 | Cook | 330/3 |
| 6,400,221 B2 | * | 6/2002 | Brown, Sr. | 330/86 |
| 8,155,348 B2 | | 4/2012 | Bray | |

* cited by examiner

*Primary Examiner* — Vivian Chin
*Assistant Examiner* — David Ton
(74) *Attorney, Agent, or Firm* — Kilpatrick Townsend & Stockton LLP

(57) ABSTRACT

A circuit and method for decoupling the perceived tone and volume of an amplified musical signal, such as a guitar amplifier, and allowing for the operator to achieve the desired sonic tone, texture and dynamic feel while separately controlling the overall perceived volume level of the amplifier device.

17 Claims, 5 Drawing Sheets

MUSICAL INSTRUMENT MASTER VOLUME AMPLIFIER

CROSS REFERENCE TO RELATED APPLICATIONS

This application claims priority to U.S. Provisional Application 61/512,269, filed Jul. 27, 2011, the disclosure of which is incorporated by reference in its entirety.

BACKGROUND OF THE INVENTION

Guitarists need instrument amplifiers capable of producing new sounds as well as high-quality approximations of signature vintage amplifier tones. Historically speaking, original vintage equipment was often under-powered, which led to the practice of turning them up to maximum volume in order to fill the room with sound. Under these operating conditions, vintage amplifiers would often distort the signal, which guitarists found beneficial to the sound quality. This created a problem for the musician, namely, how to achieve a distorted sound at lower volumes. The prior art is filled with numerous approaches to satisfy the guitarist's need for tube amplifier sound at moderate and low sound pressure levels:

In U.S. Pat. No. 6,140,870, a tube amp feeds solid-state power output section to achieve the desired sound.

In U.S. Pat. No. 4,937,874, signal conditioning is used to create a compensated output for further amplification.

In U.S. Pat. No. 5,268,527, a solid-state amp with tube amp impedance matching is utilized.

In U.S. Pat. No. 5,550,509, the output section screen voltage is reduced to control the overall volume levels.

In U.S. Pat. No. 5,727,069, a solid-state amp with tube limiting is utilized.

In U.S. Pat. No. 6,111,961, a dummy load is utilized to reduce the signal levels.

In U.S. Pat. No. 5,635,872, an adjustable power supply sag and distortion approach is utilized.

In U.S. Pat. No. 8,155,348 B2, an external phase inverter anode voltage regulation apparatus is utilized.

The problems associated with all of these various methods include complex circuitry and associated higher manufacturing costs, undesirable changes in the sound quality and/or the sensitivity or "dynamic feel" of the amplifier, as well as confusing user interfaces. Even something as simple as two knobs often requires the customer to figure out a complicated process to achieve an acceptable sound.

Each of the various approaches to reducing overall volume have some measure of limited effective operating range such as 10-20%. While it is possible to reduce the perceived volume level in most cases all the way down to "zero" sound, the perceived sound and feel of the amplifier worsens at settings beyond this range. This may be due to reliance on one "magic-bullet" approach, concept or circuit to do all of the work necessary to reduce the volume.

BRIEF DESCRIPTION OF THE DRAWINGS

The accompanying drawings, which are included to provide a further understanding of the invention and are incorporated in and constitute a part of this specification, illustrate preferred embodiments of the invention and together with the detailed description serve to explain the principles of the invention. In the drawings.

SUMMARY OF THE INVENTION

One aspect of the invention is an apparatus for amplification comprising a dual-ganged potentiometer and a control device for the dual-ganged potentiometer. The dual-ganged potentiometer further comprises an audio signal level device and a variable resistor device. Activating the control device increases resistance, limits an amount of current flow, reduces the grid bias voltage, and increases DC operating voltages. The control device may be a single input device.

In one embodiment, the apparatus maintains sound quality/distortion throughout the volume range. In another embodiment, the audio signal level device variably provides a shorting path to reference ground. In yet another embodiment, the variable resistor device is located in a cathode to ground path of a phase inverter portion of the circuit. In an alternate embodiment, DC operating voltages are increased to levels that exceed published operational levels of affected vacuum tubes. Optionally in certain embodiments, the apparatus may comprise one or more of a receiver module, an input gain module, a tone stack module, a gain recovery module, a mixdown module, a phase inverter module and an output module. In one embodiment, the ganged-potentiometer is located between a volume control and a cathode current/grid bias voltage/preamp voltage control.

Another aspect of the invention is a method for amplification comprising: crossfading between states of emphasis/de-emphasis in separate circuits within an amplifier for maintaining sound quality/distortion throughout the volume range. In one embodiment, the crossfading comprises one or more of audio signal reduction, current limiting, cathode grid bias voltage reduction and DC voltage elevation.

DETAILED DESCRIPTION OF INVENTION

Embodiments of the present invention may spread the work for reducing volume among various stages within the circuitry of the amplifier while making the user interface "one knob" simple. Various features of embodiments of the invention will be appreciated by the following descriptions. The features are described with reference to various embodiments, and should not be construed as limiting the scope of the invention in any way. Embodiments of the present invention, described herein as HYBRIDMASTER system, may effectively break the linkage between the elements of "sound quality" and "volume" allowing the guitarist to control each independent of the other.

Figure 1:
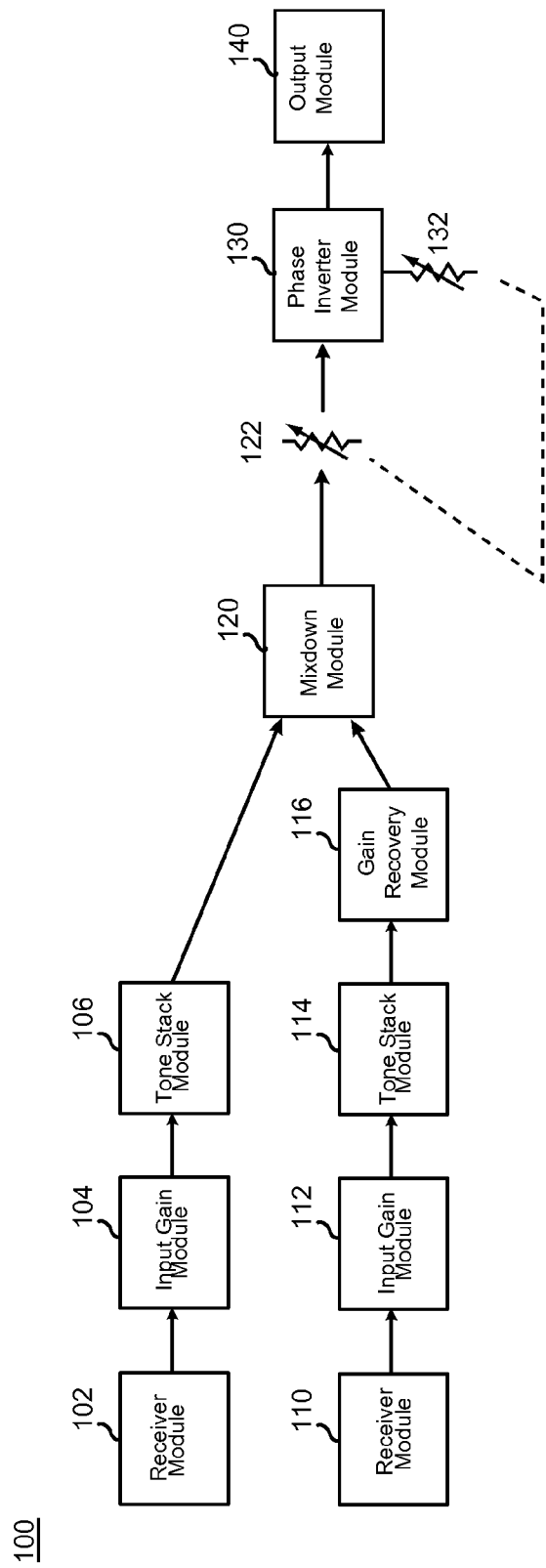
FIG. 1 is a block diagram of an exemplary embodiment of the present invention.

FIG. 1 shows the HYBRIDMASTER system may utilize a dual-ganged potentiometer consisting of variable resistors 122 and 132 to control audio signal levels as well as phase-inverter current limiting, control grid bias voltage and preamp circuitry operating voltages in a synchronized manner with a specifically chosen algorithm the governs the performance throughout the rotational operating range of the potentiometer. In one embodiment, the phase inverter circuit 130 is fed audio signals that have been prepared for further amplification in preamplifier circuitry that may include various gain stage modules, tone stack modules, gain recovery modules and mixdown modules 102-120.

Figure 2:
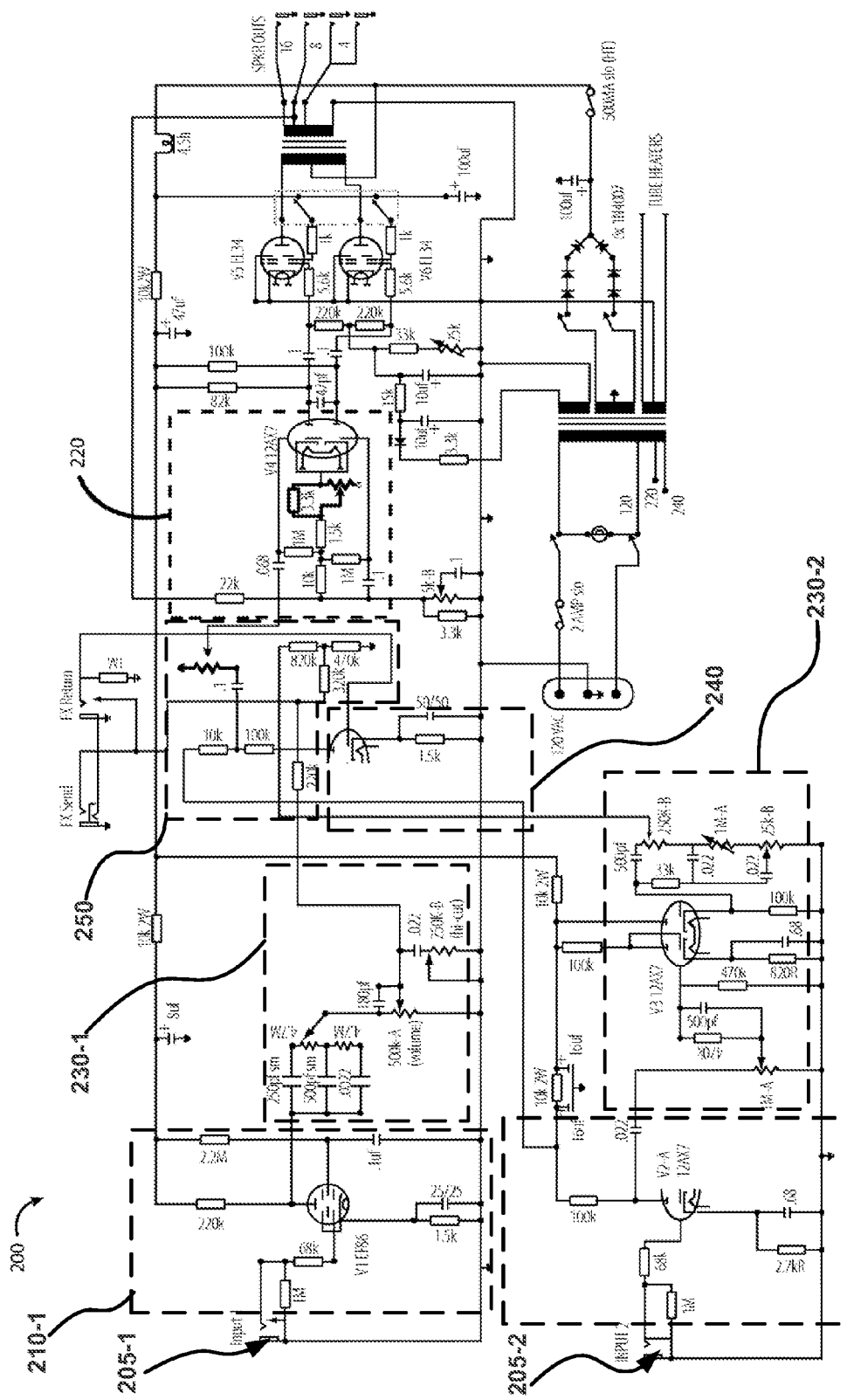
FIG. 2 is a schematic diagram of an exemplary embodiment of the present invention.

FIG. 2 shows how the HYBRIDMASTER system may be incorporated into the design of a tube guitar amplifier 200. Various embodiments may include a receiver module 205, an input gain module 210, a phase inverter tube module 220, a gain recovery module 230, a tone stack module 240, and a mixdown module 250.

Figure 2A:
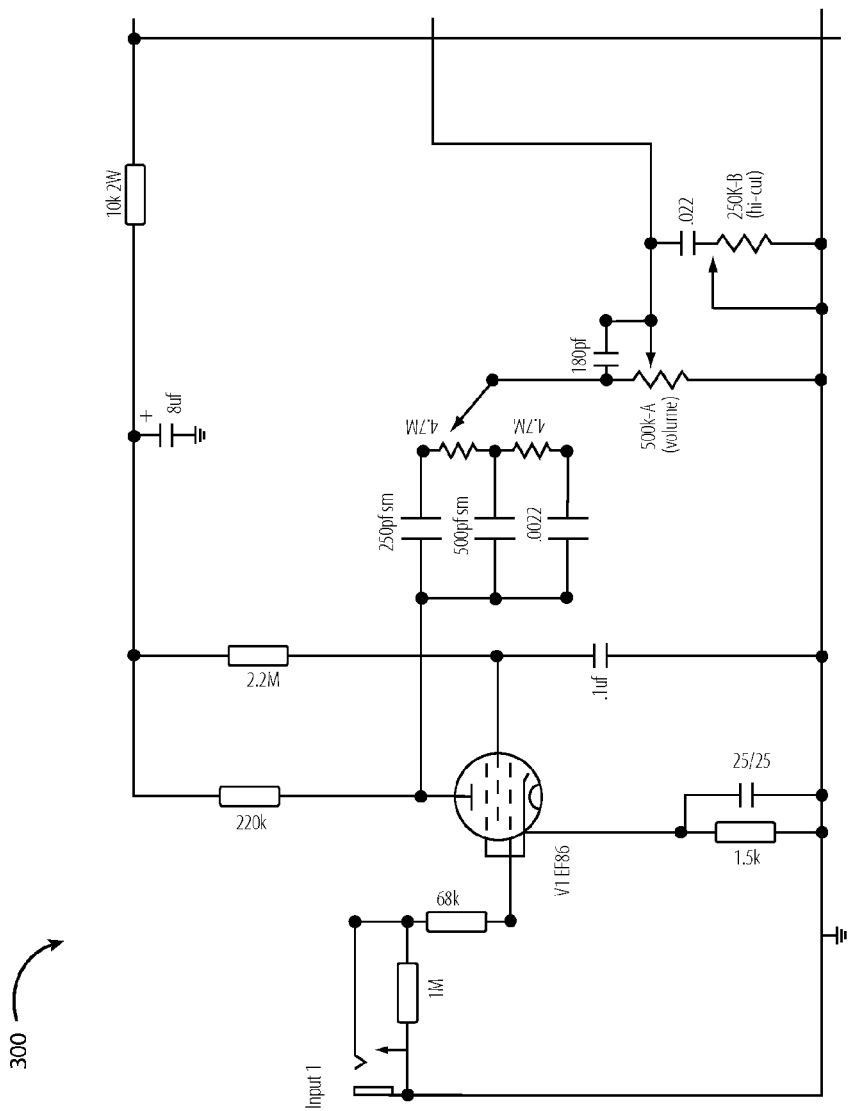
FIG. 2A is a detail of an example instrument preamplifier circuit located in the upper left side of FIG. 2.
Figure 2B:
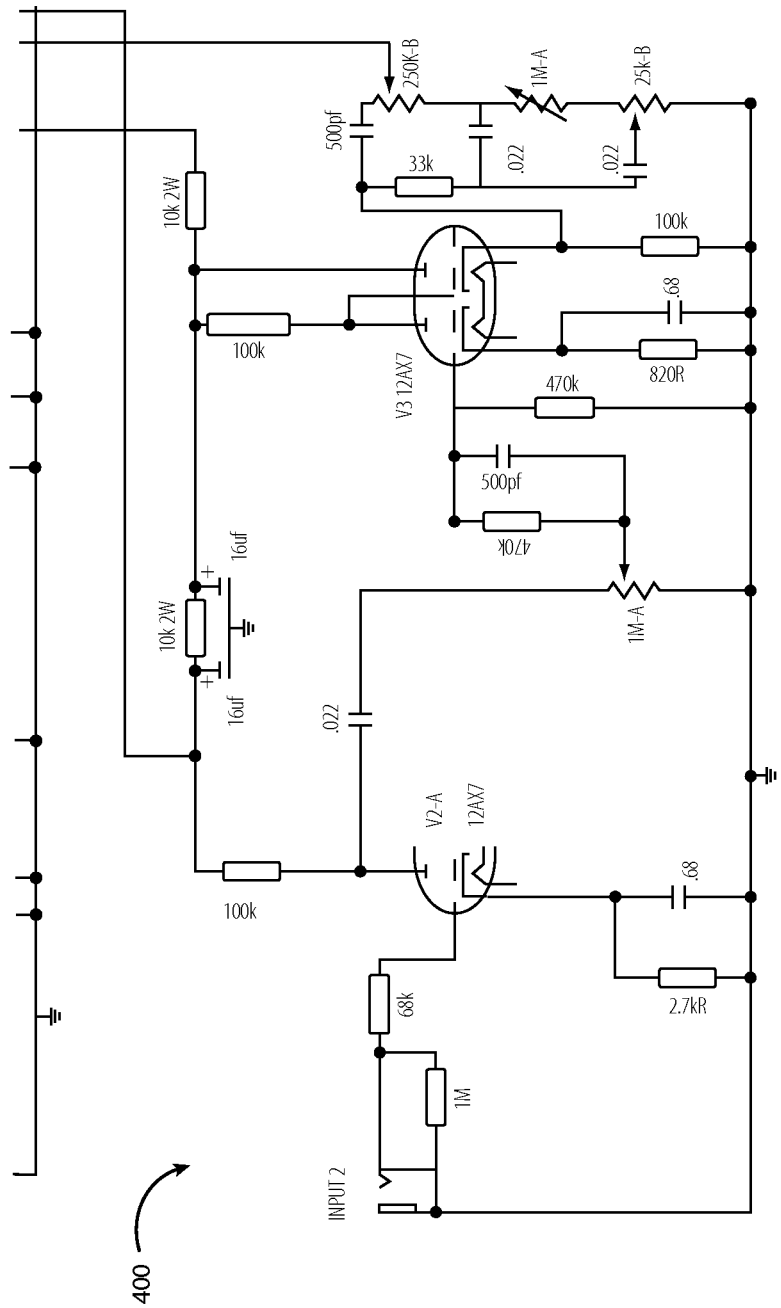
FIG. 2B is a detail of another example instrument preamplifier circuit located in the lower left side of FIG. 2.

FIGS. 2A and 2B shows an instrument preamp circuit that may feed audio signals into a phase inverter circuit.

Figure 2C:
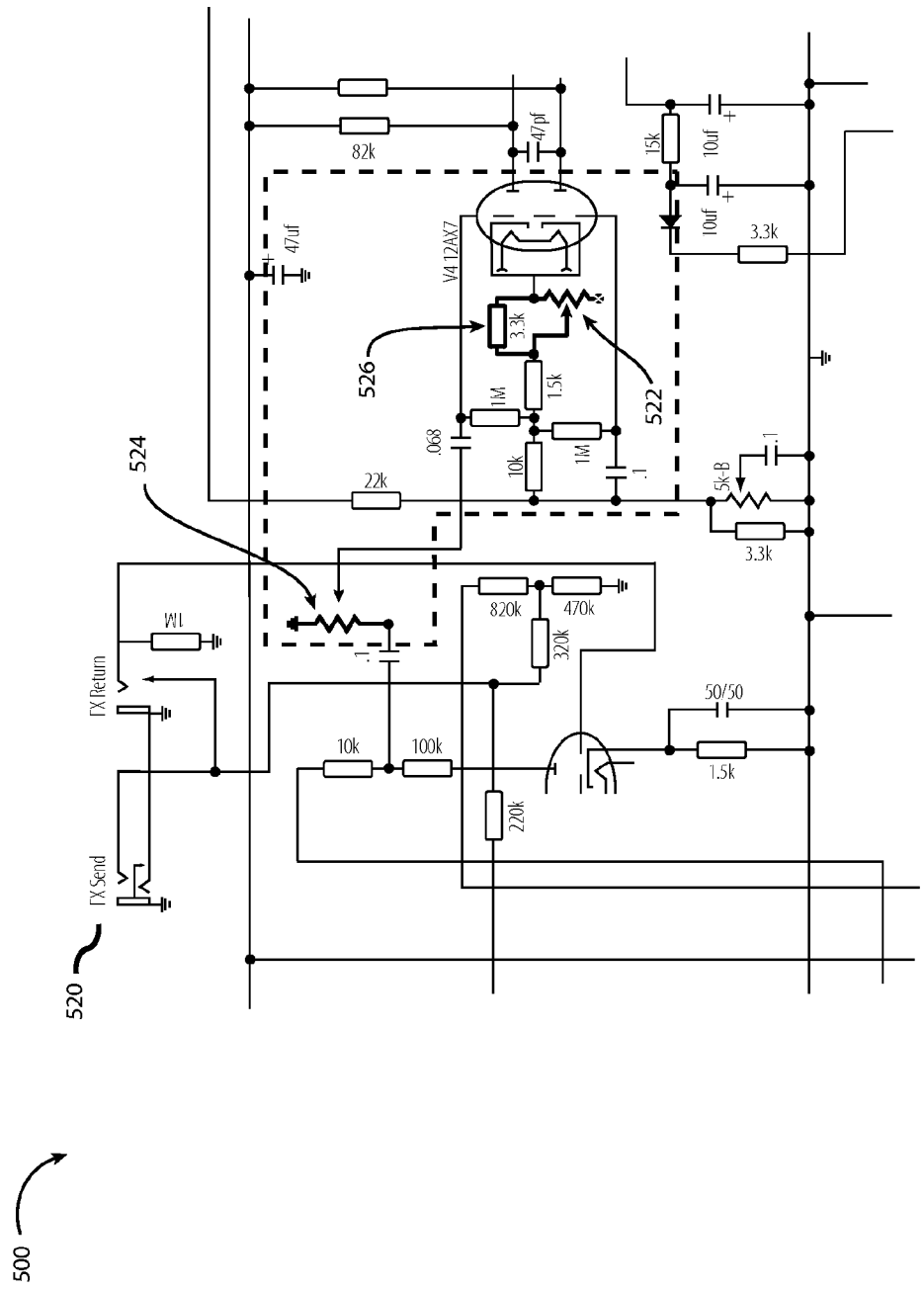
FIG. 2C is a detail of one embodiment of the HYBRIDMASTER system and an example implementation in a phase-inverter circuit such as that shown on the right side of FIG. 2.

FIG. 2C shows one embodiment of the HYBRIDMASTER system that includes a single element of the dual potentiometer, variable resistor 524, that may reduce the audio signal levels as a simple volume control that variably provides a shorting path to reference ground. The other element may be inserted as a variable resistor 522 in the cathode to ground path of the phase inverter "tail" portion of the circuit. Rotating the knob may increase resistance in this circuit and "limits" the amount of current that can flow through the phase inverter circuit thus reducing its operating effectiveness with the byproduct being a reduction in perceived audio signal. Additionally, by placing this variable resistor 522 electronically adjacent to the cathode terminal of the phase inverter triode tube at the "top of the tail" it is possible to not only regulate cathode current flow but also regulate the phase inverter triode tube control grid bias voltage. There is a sonically pleasing range of operation that when rotating the HYBRIDMASTER system control counter-clockwise, an increase to the sensitivity and gain of the phase inverter triode tube operation occurs as a direct result of reducing the control grid bias voltage to a specific pre-determined range.

In extreme settings, this circuit may be capable of reducing the signal to "zero" sound. However, in such cases, the DC operating voltages of the associated vacuum tube and those of the preamplifier raise significantly. It may be possible, without protective measures, to raise the DC voltage potential to levels that exceed the published operational levels of the affected vacuum tubes. The effective useful range of the current limiting approach may lie somewhere in the 10-20% range. In the amplifiers according to the present invention, this range may be reached once the variable resistor has gone from a value of 0 Ohms to 3.1K Ohms. In tests, a value of 50K/50K with a linear taper was optimal for the dual potentiometer. This may provide a minimal loading to the previous gain stage for the audio portion and at 50% rotation, 50% of the work has been done.

With the current limiting circuit, a 3.3K resistor 526 may be strapped across the input and the wiper of the variable resistor. This may place it in parallel with the variable resistance of the potentiometer effectively turning a variable 50K resistor into a variable 3.1K resistor. This value was chosen specifically to regulate the cathode bias voltage range from 10-15 Volts DC down to 5 Volts DC resulting in a sonically pleasing performance. Additionally, this value may provide the ideal amount of DC voltage control to limit the overall elevation of voltage potential to approximately 10V above normal operating voltage to the preamp section and approximately 20V above the normal operating voltage of the phase-inverter tube. In any case, this may guarantee that DC voltage potential does not rise to levels that even come close to exceeding the published safe operating levels of the preamp tubes.

Operationally speaking, when rotating the HYBRIDMASTER system control fully counter-clockwise, there may be no audio signal output. When rotating it fully clockwise, there may be full audio output as the control may be electronically fully removed from the associated circuitry. Starting in the full clockwise position and working backwards, the perceived sound volume may begin to drop. Throughout the counter-clockwise range of this control, the perceived audio levels may be reduced in a smooth and "natural" sounding manner. This may be due to the fact that synchronized events are occurring; one part audio signal reduction, one part current limiting and one part DC voltage elevation and one part grid bias voltage reduction. As audio signals are reduced, they may slowly loose the ability to overdrive the phase inverter stage. But, at the same time, current may be limited to the phase inverter that limits the phase inverter's ability to operate at full resolution and introduces the ability for the phase inverter to distort by starving it of headroom. Also occurring at the same time may be preamp and phase inverter DC voltage elevation, which creates greater sensitivity in the operating characteristics of the vacuum tube circuitry. The result may be that as signals are being reduced at the phase inverter, which creates less sensitivity and lower volume, operating voltages may be raised at a safe level in the preamp circuitry and grid bias voltage may be reduced in the phase inverter that combined in the manner of the present invention, enhances sensitivity. The resultant effect may be the amplifier sounding approximately the same regardless of operational volume level.

Embodiments of the present invention may have control that provides the following functionality:

300 degree rotation (fully clockwise) is the "zero point"=no perceivable reduction in sound level.

From "zero point" counter-clockwise rotation gradually decreases the signal all the way to 0% sound output.

50% counter-clockwise rotation delivers −50% reduction in sound level. Even a 70% reduction in level sounds transparent with HYBRIDMASTER system with no perceptible coloration in sound.

50K B Volume part of the circuit that acts as a simple volume control by providing the audio signal a variable path to reference ground. Typically, a 500K to 1M value is utilized for volume controls. In certain embodiments, 50K was chosen for the sound and "feel" throughout the range of the rotation.

3.1 K B current Limit/Voltage Control part of the circuit that may act as a variable resistor that when rotated counter-clockwise, increases the resistance on the cathode path to ground on V4. This may limit the amount of current that flows through the tube and may reduce the audio signal by −15-20% while simultaneously raising the DC operating voltage of all forward following DCV power supply nodes. This may also reduce the amount of control grid bias voltage. Lowering the control grid bias voltage in conjunction with raising the DCV operating point of preceding preamp stage gain modules may create greater sensitivity to input audio signals. It will be appreciated that the 3.1K value of this portion of the circuit may be created by placing a 3.3K resistor in parallel with the input and the wiper of the variable resistor.

Synchronization & Algorithm

As the HYBRIDMASTER system control is engaged and rotated counter-clockwise, the perceived audio loudness is reduced due to one part audio signal attenuation and one part current limiting, which reduces the phase-inverters ability to amplify the signal, thus lowering the volume. While these two elements work in tandem to reduce the signal level, the grid bias voltage of the phase inverter is going down while the operating voltage of the entire preamp section is going up. This increases the sensitivity of the entire preamp circuitry. In essence, embodiments of the present invention are crossfading between states of emphasis/de-emphasis in separate circuits within the amplifier.

Through research and testing, current limiting must be controlled to allow only a variable effective reduction of 15-25%. Additionally, control grid bias must be controlled to allow only a variable reduction of 25-35%. Beyond that, the signal degradation may no longer be acceptable. Additionally, the amount of downstream voltage increase must preferably be limited to a range of 7V-10V. Beyond that, the increased sensitivity may no longer sound natural.

Decoupling the link between "volume" and tone of the amplifier is somewhat of a "holy grail" for tube amps. The HYBRIDMASTER system may do a superior job at achieving this by doing work in multiple areas in the amplifier with a low-cost, easy to implement, easy to operate solution. Prior art devices are complex, more expensive and often attempt to do all of the work in only one circuit. With custom components, it may be possible to increase the effectiveness of the HYBRIDMASTER system by including additional points of signal reduction in this process.

While this invention is satisfied by embodiments in many different forms, as described in detail in connection with preferred embodiments of the invention, it is understood that the present disclosure is to be considered as exemplary of the principles of the invention and is not intended to limit the invention to the specific embodiments illustrated and described herein. Numerous variations may be made by persons skilled in the art without departure from the spirit of the invention. The scope of the invention will be measured by the appended claims and their equivalents.

The invention claimed is:

1. A guitar amplifier for decoupling a perceived tone and volume of an electric guitar, the guitar amplifier comprising:
   a dual-ganged potentiometer
      which further comprises a current limiting device and a variable resistor device, wherein the variable resistor device receives a first audio signal to produce a second audio signal;
   a dual-ganged potentiometer control device simultaneously controls both the current limiting device and the variable resistor;
   a phase inverter module coupled to the current limiting device and the variable resistor device to receive the second audio signal and output an inverted and a non-inverted audio signal; and
   an output module coupled to the phase inverter module and configured to produce an audio output signal, wherein the dual-ganged potentiometer control device
      synchronously attenuates the second audio signal with respect to the first audio signal using the variable resistor device, and
      limits current flow of the phase inverter module using the current limiting device.

2. The guitar amplifier of claim 1, wherein the dual-ganged potentiometer control device is a single input device.

3. The guitar amplifier of claim 1, wherein the guitar amplifier maintains sound quality/distortion throughout the volume range.

4. The guitar amplifier of claim 1, wherein the current limiting device variably provides a shorting path to reference ground.

5. The guitar amplifier of claim 1, wherein the variable resistor device is located in a cathode to ground path of a phase inverter portion of the circuit.

6. The guitar amplifier of claim 1, further comprising a receiver module.

7. The guitar amplifier of claim 1, further comprising an input gain module.

8. The guitar amplifier of claim 1, further comprising a tone stack module.

9. The guitar amplifier of claim 1, further comprising a gain recovery module.

10. The guitar amplifier of claim 1, further comprising a mixdown module.

11. The guitar amplifier of claim 1, further comprising a phase inverter module.

12. The guitar amplifier of claim 1, wherein the dual-ganged potentiometer is located between a volume control and a cathode current/grid bias voltage/preamp voltage control.

13. A method for decoupling a perceived tone and volume of an electric guitar, the method comprising:
   receiving a first audio signal to produce a second audio signal with a variable resistor device;
   simultaneously controlling both a current limiting device and the variable resistor with a dual-ganged potentiometer control device;
   receiving the second audio signal with a phase inverter module, which is coupled to the current limiting device and the variable resistor device;
   outputting an inverted and a non-inverted audio signal with the phase inverter module; and
   producing an audio output signal by an output module coupled to the phase inverter module, wherein the dual-ganged potentiometer control device:
      synchronously attenuates the second audio signal with respect to the first audio signal using the variable resistor device, and
      limits current flow of the phase inverter module using the current limiting device.

14. The method of claim 13, wherein the dual-ganged potentiometer control device is a single input device.

15. The method of claim 13, wherein the dual-ganged potentiometer control device maintains sound quality/distortion throughout the volume range.

16. The method of claim 13, wherein the current limiting device variably provides a shorting path to reference ground.

17. The method of claim 13, wherein the variable resistor device is located in a cathode to ground path of a phase inverter portion of the circuit.

* * * * *